United States Patent
Fürst et al.

(10) Patent No.: US 8,441,001 B2
(45) Date of Patent: May 14, 2013

(54) PHOTODETECTOR, FLAT X-RAY DETECTOR AND METHOD FOR PRODUCING THE SAME

(75) Inventors: Jens Fürst, Heßdorf (DE); Debora Henseler, Erlangen (DE); Georg Wittmann, Herzogenaurach (DE)

(73) Assignee: Siemens Aktiengesellschaft, Munich (DE)

( * ) Notice: Subject to any disclaimer, the term of this patent is extended or adjusted under 35 U.S.C. 154(b) by 777 days.

(21) Appl. No.: 12/063,055

(22) PCT Filed: Aug. 4, 2006

(86) PCT No.: PCT/EP2006/065079
§ 371 (c)(1),
(2), (4) Date: Feb. 6, 2008

(87) PCT Pub. No.: WO2007/017474
PCT Pub. Date: Feb. 15, 2007

(65) Prior Publication Data
US 2010/0148072 A1    Jun. 17, 2010

(51) Int. Cl.
*H01L 51/42* (2006.01)
*H01L 51/44* (2006.01)
(52) U.S. Cl.
USPC ............... 257/40; 257/E31.086; 257/E51.017
(58) Field of Classification Search .................... 257/40, 257/E31.086, E51.017, 759
See application file for complete search history.

(56) References Cited

U.S. PATENT DOCUMENTS

| | | | | |
|---|---|---|---|---|
| 5,347,590 A | * | 9/1994 | Nonnweiler et al. | ......... 382/132 |
| 5,707,745 A | * | 1/1998 | Forrest et al. | .................. 428/432 |
| 5,953,587 A | * | 9/1999 | Forrest et al. | .................... 438/99 |
| 6,198,091 B1 | * | 3/2001 | Forrest et al. | ............... 250/214.1 |
| 6,483,099 B1 | | 11/2002 | Yu et al. | |
| 6,664,071 B1 | | 12/2003 | Windhab et al. | |
| 7,510,885 B2 | | 3/2009 | Halls et al. | |
| 2003/0025084 A1 | | 2/2003 | Honda et al. | |
| 2004/0016923 A1 | | 1/2004 | Yu et al. | |
| 2004/0258204 A1 | * | 12/2004 | Nokita et al. | .................... 378/91 |
| 2005/0045808 A1 | | 3/2005 | Yonezawa et al. | |
| 2005/0196969 A1 | * | 9/2005 | Gunner et al. | ................. 438/725 |
| 2005/0248260 A1 | * | 11/2005 | Sellars et al. | .................. 313/500 |
| 2006/0145365 A1 | * | 7/2006 | Halls et al. | ............. 257/E51.022 |
| 2006/0186400 A1 | * | 8/2006 | Okada et al. | .................... 257/40 |
| 2008/0142721 A1 | | 6/2008 | Spahn | |

OTHER PUBLICATIONS

Krishnan et al., Fluorinated Polymers: Liquid Crystalline Properties and Applications in Lithography, The Chemical Record, vol. 4, 315-330 (2004).*

* cited by examiner

*Primary Examiner* — Fernando L Toledo
*Assistant Examiner* — Peter Bradford
(74) *Attorney, Agent, or Firm* — Schiff Hardin LLP (57) ABSTRACT

A flat organic photodetector has a structured first electrode that forms several sub-electrodes, a second electrode, at least one first organic layer, and a second organic layer. The organic layers are situated between the two electrodes and are structured in conformity with the structuring of the first electrode, so that the two organic layers are subdivided into multiple active regions respectively corresponding to the sub-electrodes of the first electrode. An x-ray detector has such a flat organic photodetector and an x-ray absorbing layer applied thereon.

15 Claims, 7 Drawing Sheets

PHOTODETECTOR, FLAT X-RAY DETECTOR AND METHOD FOR PRODUCING THE SAME

BACKGROUND OF THE INVENTION

1. Field of the Invention

The present invention concerns a laminar organic photodetector, an organic x-ray flat panel detector, method for production of a laminar organic photodetector, and a method for production of an organic x-ray flat panel detector.

2. Description of the Prior Art

With a laminar photodetector, light striking the photodetector is transduced into electrical signals that can be converted into an image data set with a suitable evaluation device. Laminar organic photodetectors, namely photodetectors with a photoactive layer made from an organic semiconductor material, represent an interesting alternative to photodetectors with a photoactive layer made from an inorganic material.

The production of an x-ray flat panel detector with an organic photodetector can be relatively cost-effective, it is the object of an x-ray flat panel detector to transduce an x-ray radiation penetrating through an examination subject (and thereby attenuated) into corresponding electrical signals that can then in turn be converted into an x-ray image data set with an evaluation device. The x-ray image associated with the x-ray image data set can be visualized with a viewing apparatus. Such an x-ray flat panel detector is known from United States Patent Application Publication No. 2003/0025084 A1, for example.

In particular, large-area photodetectors as are sometimes used for x-ray flat panel detectors, can be produced relatively cost-effectively because the organic layers of the organic photodetector can be applied over a large area with relatively cost-effective methods such as, for example, with rotation coating (spin coating), scraping or printing techniques.

Figure 1:
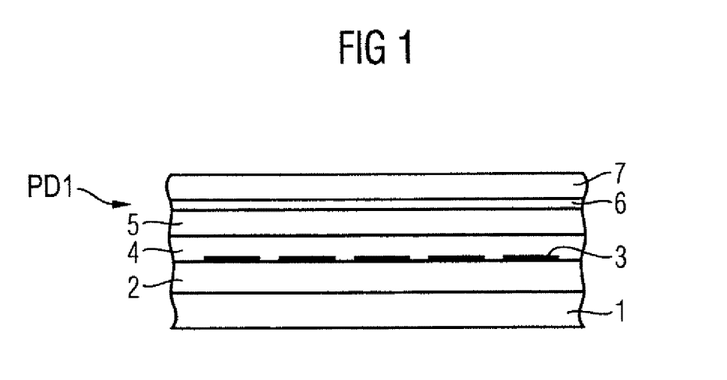
FIG. 1 shows a sectional view of a portion of an organic photodetector.

FIG. 1 shows in section an example of a laminar organic photodetector PD1 for explanation of the general problem associated therewith.

The photodetector PD1 shown in section in FIG. 1 has a number of layers 1 through 7 attached to one another. The known photodetector PD1 has a laminar substrate 1 in which transistors (not shown in FIG. 1) are embedded in a matrix configuration. Each of the individual transistors is associated with one of the pixels of the image to be acquired with the photodetector PD1.

Figure 2:
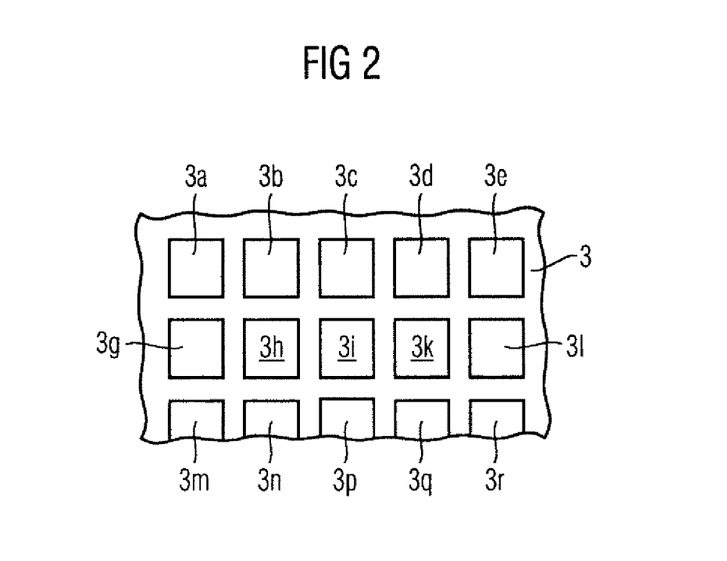
FIG. 2 is a plan view of the portion of the photodetector shown in FIG. 1.

A passivation layer 2 is applied on the substrate 1, on which passivation layer 2 is structured in turn (for example by means of a lithography process) a laminar and structured electrode 3 that is shown in section in plan view in FIG. 2. For example, the structured electrode 3 is formed of gold, platinum, palladium, silver or indium-tin oxide.

As can be seen from FIG. 2, the electrode 3 is structured like a matrix and has a number of sub-electrodes 3a through 3r that are electrically insulated from one another. Each of the sub-electrodes 3a through 3r is electrically connected with one of the respective transistors of the substrate 1. Each of the sub-electrodes 3a through 3r is therefore respectively associated with one of the pixels of the image to be acquired with the photodetector PD1.

An organic hole transport layer 4 (for example made from PEDOT:PSS) is applied over the area of the laminar and structured electrode 3. A photoactive layer 5 (made from an organic semiconductor material, for example poly-3-hexylthiophene/PCBM) is in turn applied over the area of the laminar organic hole transport layer 4.

The laminar organic photoactive layer 5 connects to an unstructured, at least semi-transparent laminar electrode 6. The laminar electrode 6 is, for example, a thin metal layer made from calcium or silver. In order to protect the photodetector PD1 from damage and degradation due to oxygen and moisture, a protective layer 7 is finally applied on the electrode 6. The protective layer is formed, for example, of glass, an optimally transparent polymer, or a multi-layer system made from organic polymers and inorganic barrier layers such as $Al_2O_3$ or $Si_3N_4$.

If an image is to be acquired with the photodetector PD1, the light distribution associated with the image thus penetrates the protective layer 7 and the at least semi-transparent electrode 6 and is transduced into electrical signals by the photoactive layer 5 in connection with the hole transport layer 4 and the two electrodes 6 and 3, which electrical signals are read out with the transistors of the substrate 1. The read signals are in turn relayed to an evaluation device (not shown in FIGS. 1 and 2 but known to those skilled in the art) and are processed into an image data set. The image data set can then be visualized as an image with a viewing apparatus (likewise not shown in FIGS. 1 and 2).

The image is constructed of a number of pixels. Each of the sub-electrodes 3a through 3r of the structured laminar electrode 3 or each transistor of the substrate 1 that is connected with a corresponding sub-electrode is associated with one of these pixels.

The two organic layers 4 and 5 have a relatively high conductivity and therefore a relatively high quantum efficiency in a range from 60% to 85%. However, since the two organic layers 4 and 5 are applied unstructured over the area of on the structured electrode 3 and the two organic layers have a relatively high transverse conductivity (i.e. a conductivity parallel to their area dimensions), it leads to a relatively large crosstalk of the electrical signals destined for the respective sub-electrodes 3a through 3r or their associated transistors of the substrate 1. A limited spatial resolution of the image acquired with the photodetector PD1 is the consequence.

SUMMARY OF THE INVENTION

An object of the invention to provide a laminar organic photodetector and an x-ray flat panel detector with an organic photodetector such that the spatial resolution of the image acquired with the photodetector or of the x-ray image acquired with the x-ray flat panel detector is improved. It is a further object of the invention to specify suitable methods for production of such a laminar organic photodetector or, respectively, x-ray flat panel detector.

This object is achieved in accordance with the present invention by a laminar organic photodetector having a structured first electrode having a number of sub-electrodes, a second electrode, at least one first organic layer and a second organic layer, wherein the two organic layers are arranged between the two electrodes and are structured corresponding to the first electrode such that the two organic layers are sub-divided into a number of active regions associated with the individual sub-electrodes of the first electrode. It is the basic idea for the present inventive photodetector that the two organic layers are not applied unstructured on the structured electrode (whose sub-electrodes are respectively associated with one pixel of the image to be acquired with the printing device), as is typical according to the prior art. Instead, the two organic layers are likewise structured corresponding to the structured electrode. Due to the structuring of the organic layers, an active region of the organic layers is associated with each of the sub-electrodes of the first electrode, meaning that not only one sub-electrode of the first electrode but also an active region of the organic layers is associated with each pixel of the image acquired with the photodetector. This meets requirements that the individual active regions associated with the pixels of the photodetector have optimally little influence. Crosstalk within the organic layers of the signals associated with the image to be acquired can thus at least be significantly reduced, so the spatial resolution of the acquired image is improved.

The two organic layers are a photoactive layer and a hole transport layer made from organic materials. Suitable organic materials for the photoactive layer are, for example, poly-3-hexylthiophene (P3HT) or general poly-3-alhylthiophene (P3AT) and PPVs as hole-transporting materials or PCBM as electron-transporting materials. Further organic materials are, among others, CuPc/PTCBI, ZNPC/C60, conjugated polymer components or fullerene components. PEDOT:PSS is also a suitable organic material for the hole transport layer, for example.

According to one variant of the inventive photodetector, the active regions of the organic layers are separated from one another by trenches. The trenches can advantageously be inserted into the organic layers with a laser. For production-related reasons it has proven to be advantageous when, according to preferred variants of the inventive organic photodetector, the trenches of the two organic layers have a width smaller than 50 µm and/or a width greater than 5 µm.

According to a preferred embodiment of the inventive laminar organic photodetector, an additional material divides the active regions of the two organic layers from one another. The additional material is, for example, a photoresist that is initially applied to the first electrode in the production of the photodetector and, for example, exhibits an overhanging structure. Given an overhanging structure, regions of the webs of the wall structure that are further removed from the first electrode overhang the active regions, similar to a mushroom. Overhanging structures are, for example, known from the technology for organic LEDs and known as "mushrooms" (mushrooms). The two organic layers can subsequently be applied on the first electrode provided with the photoresist, such that the individual active regions of the two organic layers are separated by the photoresist. The photoresist structure preferably has a width smaller than 20 µm and/or a width greater than 2 µm.

According to a preferred embodiment of the inventive laminar organic photodetector, the additional material has a property of repelling the organic materials of the organic layers. Examples of such a material are a fluorinated photoresist or a photoresist on which a fluorinated plasma is applied. In the production of the photodetector the photoresist is applied at the points on the first electrode at which the individual active regions of the organic layers should be separated from one another. Due to the poor wettability of, for example, the fluorinated photoresist, the two organic layers are interrupted at the points at which the fluorinated photoresist is applied, wherein the organic layers are structured. The individual webs of the wall structure preferably have a relatively flat angle of approximately 3° to 30° relative to the first electrode. It is thereby possible to vacuum deposit or sputter the two electrodes onto the organic layers. Moreover, requirements that the two electrodes do not tear are met due to the relatively flat angle.

The two electrodes are an anode/cathode pair. Depending on whether the first electrode is a cathode or an anode, the first organic layer is either the hole transport layer or the photoactive layer.

In order to protect the inventive organic photodetector from contamination, damage or degradation, according to an embodiment of the photodetector a laminar protective layer is applied on the second electrode.

Since the use of organic photodetectors is particularly interesting for x-ray flat panel detectors, it is provided in particular to use the inventive organic photodetector as an x-ray flat panel detector. Such an inventive x-ray flat panel detector comprises a layer absorbing x-rays, which layer is applied on the inventive laminar organic photodetector. A suitable layer absorbing x-rays (which layer is also designated as a scintillator) comprises cesium iodide, for example.

A further object of the invention is achieved by a method for production of a laminar organic photodetector that exhibits a structured first electrode having a number of sub-electrodes, a second electrode, a first organic layer and a second organic layer; wherein the two organic layers are arranged between the two electrodes and are structured corresponding to the first electrode; such that the two organic layers are sub-divided into a number of active regions associated with the individual sub-electrodes of the first electrode; including the following steps:

application of an intermediate material on the structured first electrode, wherein the intermediate material exhibits a wall structure corresponding to the structure of the two organic layers, laminar application of the first organic layer on the first laminar electrode, laminar application of the second organic layer on the first organic layer and laminar application of the second electrode on the second organic layer.

One difficulty in the structuring of the organic layers is that the organic layers are not damaged in the structuring process. Based on the inventive method it is proposed to produce the inventive organic photodetector layer by layer. The structured first electrode is initially produced as is already typical, for example. The intermediate material (that, according to a preferred variant of the inventive method, is a photoresist) is subsequently applied on the structured first electrode, in particular by means of a lithographic process. Due to the wall structure the two organic layers should be separated into the active regions upon subsequent application.

According to an advantageous variant of the inventive method, the wall structure is an overhanging structure. Methods for production of an overhanging structure for a photoresist structure are known in the production of organic LEDs, for example.

The two organic layers (which are the photoactive layer and the organic hole transport layer) are subsequently applied in succession on the structured first electrode on which the wall structure is applied. The two organic layers are thereby sub-divided by the overhanging wall structure into a number of active regions independent of one another. The wall structure is preferably executed such that active regions are separated from one another by at least 2 µm and at maximum 20 µm.

Finally, the second electrode is applied on the two organic layers. The second electrode can additionally be coated with an optimally transparent protective layer, for example made from glass or an optimally transparent synthetic.

According to a further preferred embodiment of the inventive method, the intermediate material has a property of repelling the organic materials of the organic layers. An example of such a photoresist is a fluorinated photoresist. Due to the repellent property of the photoresist, upon application of the organic layers on the first electrode these are poorly wetted, wherein the structuring of the organic layers arises.

The second object of the invention is also achieved by a method for production of a laminar organic photodetector comprising the following method steps:

laminar application of a first organic layer on a structured first electrode that, due to the structuring, comprises a number of sub-electrodes, laminar application of a second organic layer on the first organic layer, insertion of a trench structure into the two organic layers with a laser, whereby the trench structure corresponds to the structure of the first electrode and laminar application of a second electrode on the second organic layer.

After the two organic layers have been applied on the structured first electrode, the trenches (which preferably have a width smaller than 50 μm and/or greater than 5 μm) are thus inventively lazed into the organic layers (laser patterning process). In particular if a laser with light in the visible or near-UV range is used, a damage of the organic layers due to the lasers is thus not to be expected.

In order to protect the photodetector, the second electrode can additionally be coated with an optimally transparent protective layer (for example made from glass or an optimally transparent synthetic).

DESCRIPTION OF THE PREFERRED EMBODIMENTS

Figure 3:
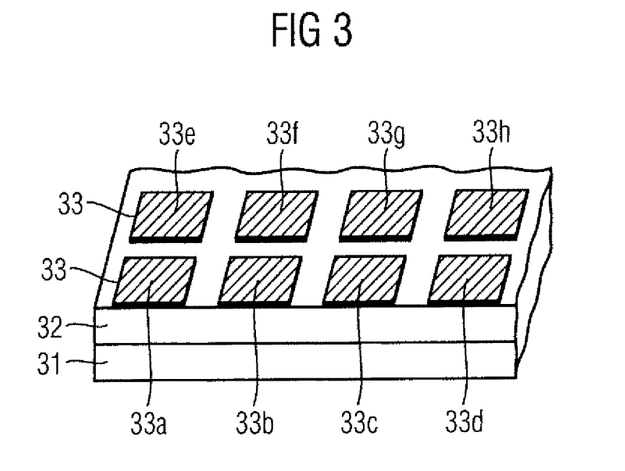
FIGS. 3 through 6 respectively show stages in the production of the organic photodetector in accordance with the present invention.

The production of an inventive photodetector PD2 is illustrated with FIGS. 3 through 6:

FIG. 3 shows a portion of substrate 31 with an applied passivation layer 32. The substrate 31 comprises a number of transistors (not shown in detail in Figures) arranged like a matrix that, in the case of the present exemplary embodiment, are thin film transistors (TFTs). In principle the substrate 31 can also embody other transistors such as in particular organic field effect transistors.

A structured laminar electrode 33 (that, in the case of the present exemplary embodiment, is produced from gold) is applied on the passivation layer 32. The electrode 33 is structured like a matrix, wherein it is sub-divided into a number of sub-electrodes 33a through 33h electrically insulated from one another. Each of the sub-electrodes 33a through 33h is electrically connected with one of the transistors of the substrate 31 and is thus respectively associated with a pixel of an image to be acquired with the photodetector PD2.

Figure 4:
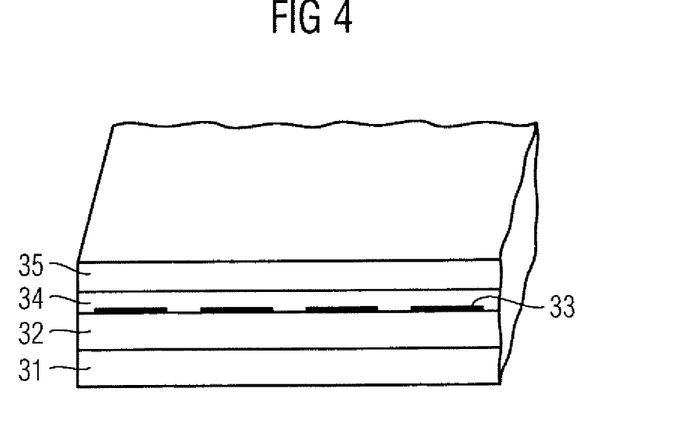

A hole transport layer 34 made of an organic material is subsequently areally applied on the structured electrode 33, for example by rotation coating (spin coating), scraping or printing techniques. In the case of the present exemplary embodiment PEDOT:PSS is used as an organic material. A photoactive layer 35 made from an organic semiconductor material (P3HT/PCBM in the case of the present exemplary embodiment) is subsequently applied on the hole transport layer 34, as is illustrated in FIG. 4.

Figure 5:
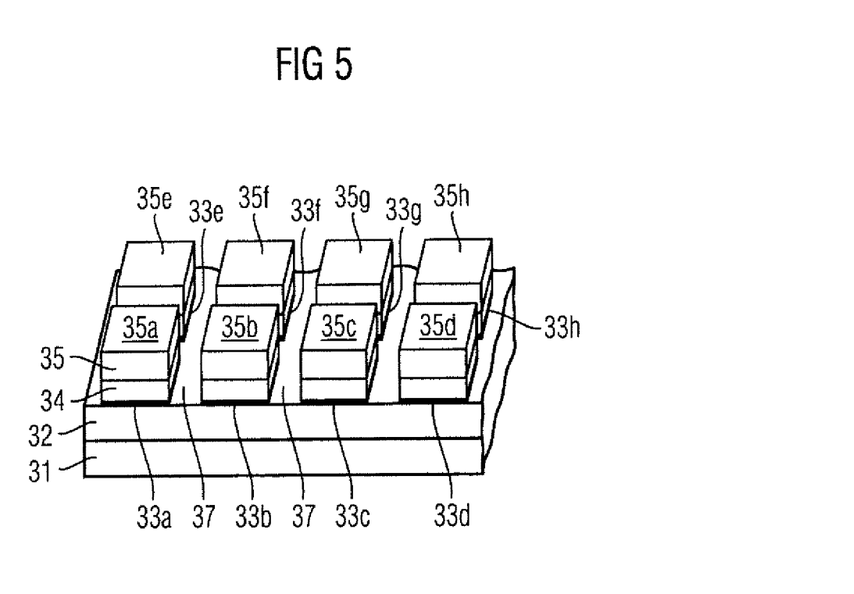

Before the photoactive layer 35 is now provided with a laminar electrode 36, the two organic layers (i.e. the photoactive layer 35 and the hole transport layer 34) are structured with a laser (not shown in Figures), as this is shown in FIG. 5.

In the case of the present exemplary embodiment, trenches 37 with a width from 5 μm up to a maximum of 50 μm are lazed into the two organic layers 34 and 35 with the laser. The trenches 37 are placed and are deep enough such that the hole transport layer 34 and the photoactive layer 35 are sub-divided into active regions 35a through 35h separated from one another, of which respectively one active region 35a through 35h interacts with respectively one sub-electrode 33a through 33h of the electrode 33, but is not electrically connected with adjacent sub-electrodes 33a through 33h. In order to not damage the two organic layers 34 and 35, in the case of the present exemplary embodiment a laser that emits light in the visible or near-UV range is used.

Figure 6:
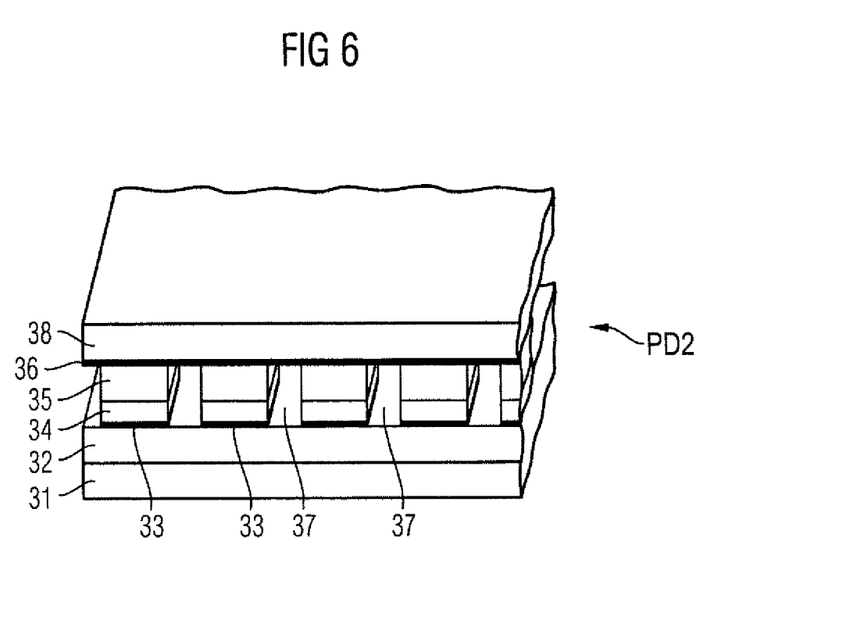

The unstructured laminar electrode 36, which in the present exemplary embodiment is provided with a protective layer 38 made from glass, is subsequently applied on the structured photoactive layer 35. This is shown in FIG. 6.

FIGS. 7 through 10 illustrate an alternative method for production of an inventive photodetector PD3. If it is not specified otherwise in the following, components of the photodetector PD3 shown in FIGS. 7 through 10 which are largely structurally and functionally identical with components of the photodetector PD2 shown in FIGS. 3 through 6 are provided with the same reference characters.

In contrast to the production methods illustrated in FIGS. 3 through 6, in the alternative production method a photoresist is initially applied on the structured electrode 33, which photoresist is structured like a matrix by means of a lithographic process (known, for example, in the production of organic LEDs or inorganic components). The arising photoresist structure 71 is shown in detail in FIG. 7.

Figure 7:
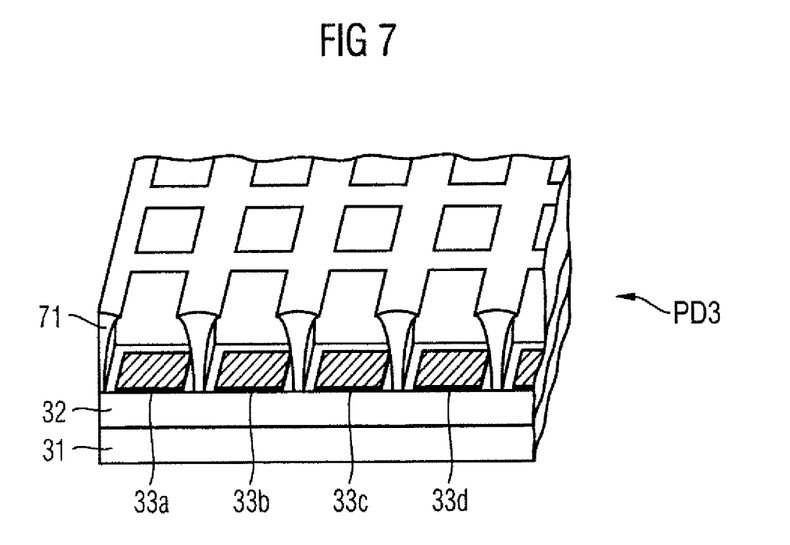
FIGS. 7 through 10 respectively show stages in the production of a further embodiment of an organic photodetector in accordance with the present invention.

As can be seen from FIG. 7, in the case of the present exemplary embodiment the photoresist structure 71 is an overhanging structure in which photoresist is applied in the regions in which the individual sub-electrodes 33a through 33h are electrically insulated from one another and the active regions of the individual sub-electrodes 33a through 33h are essentially free of photoresist. Given an overhanging structure, regions of the photoresist structure 71 that are further removed from the electrode 22 overhang the sub-electrodes 33a-33h. In the case of the present exemplary embodiment, the overhanging photoresist structure 71 has a width from 2 μm to a maximum of 20 μm.

A hole transport layer 74 made from an organic material is subsequently applied on the structured electrode 33 provided with the photoresist structure 71. In the exemplary embodiment, PEDOT:PSS is used as an organic material. The electrode 33 provided with the hole transport layer 74 is shown in FIG. 8.

Figure 9:
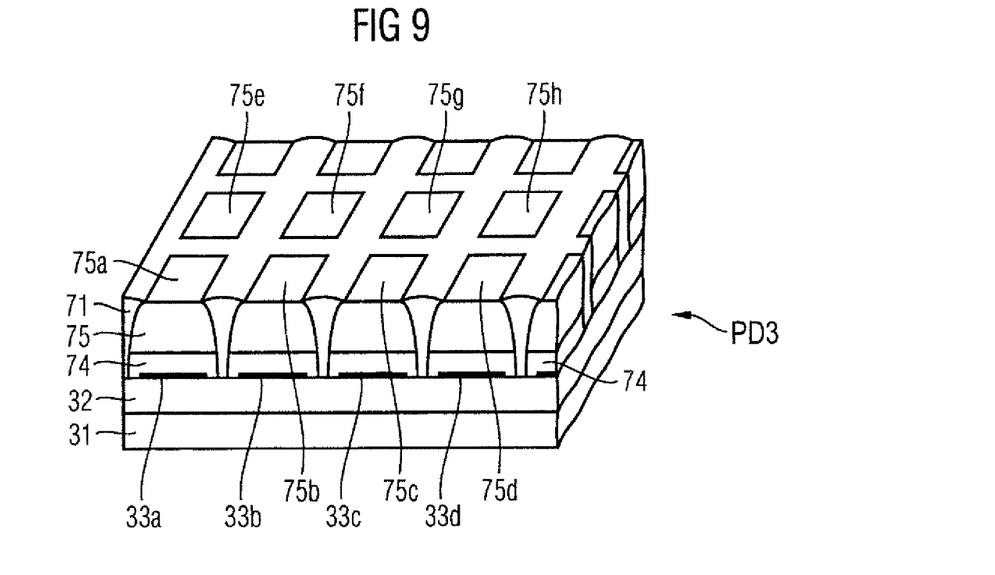

A photoactive layer 75 made from an organic semiconductor material (P3HT/PCBM in the case of the present exemplary embodiment) is subsequently applied on the hole transport layer 74, as is illustrated in FIG. 9.

Figure 8:
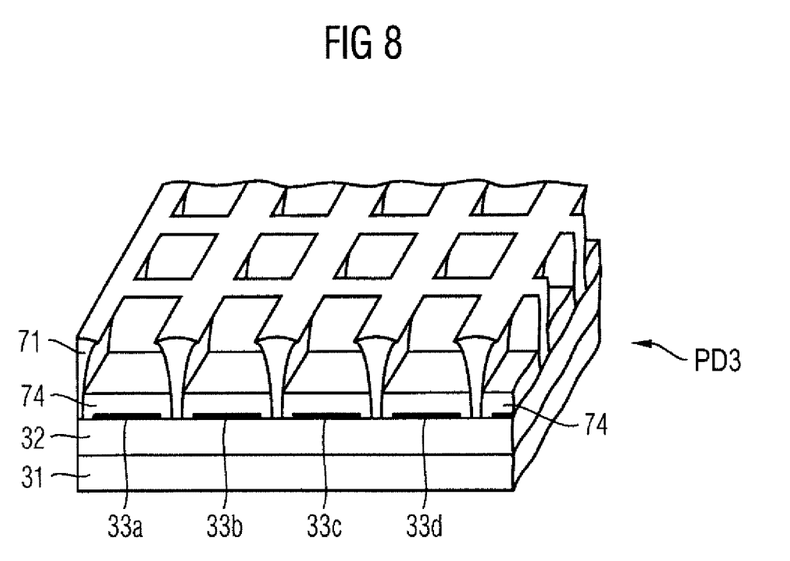

As can be seen from FIGS. 8 and 9, the photoresist structure 71 causes the hole transport layer 74 and the photoactive layer 75 to be sub-divided into active regions 75a through 75h separated from one another, of which respectively one active region 75a through 75h interacts with respectively one sub-electrode 33a through 33h of the electrode 33, however adjacent sub-electrodes are optimally uninfluenced.

Figure 10:
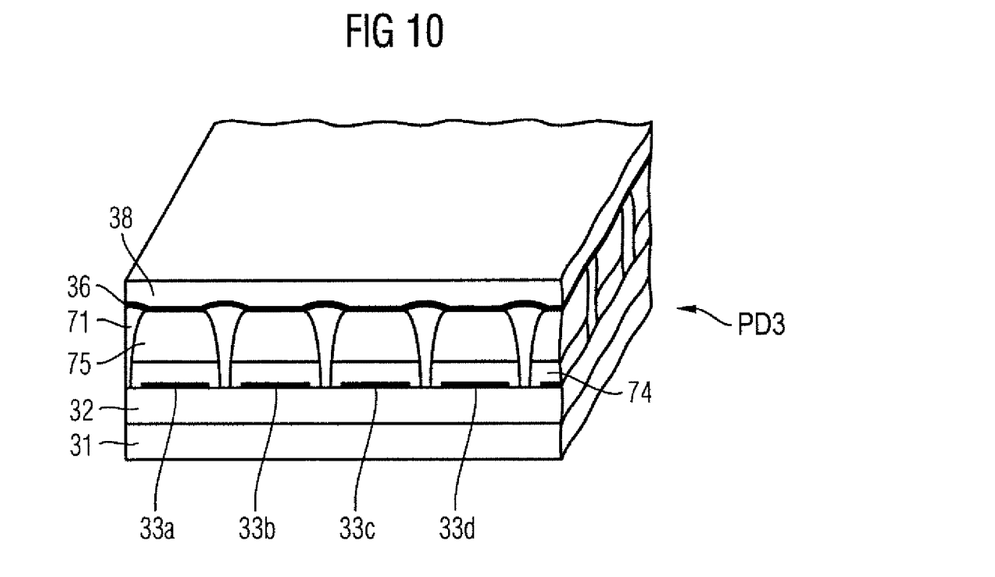

An unstructured laminar electrode 36 that, in the case of the present exemplary embodiment, is provided with a protective layer 38 made from glass is subsequently applied on the photoactive layer 75. This electrode 36 is shown in FIG. 10.

The production of a further flat panel detector PD4 is shown in FIGS. 11 through 14. If it is not specified otherwise in the following, components of the photodetector PD4 shown in FIGS. 11 through 14 which are largely structurally and functionally identical with components of the photodetector PD3 shown in FIGS. 7 through 10 are provided with the same reference characters.

Figure 11:
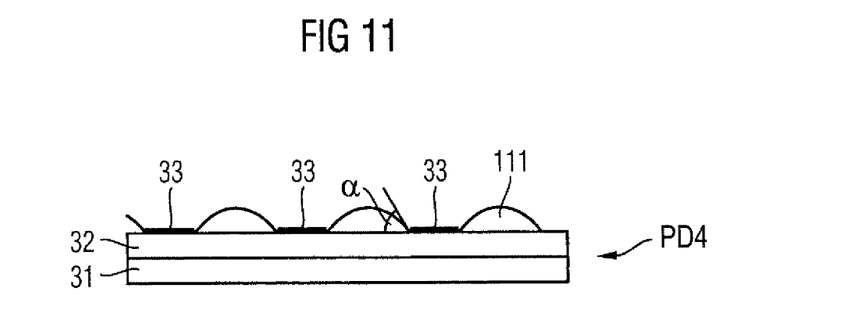
FIGS. 11 through 14 respectively show stages in the production of another embodiment of an organic photodetector in accordance with the present invention.
Figure 12:
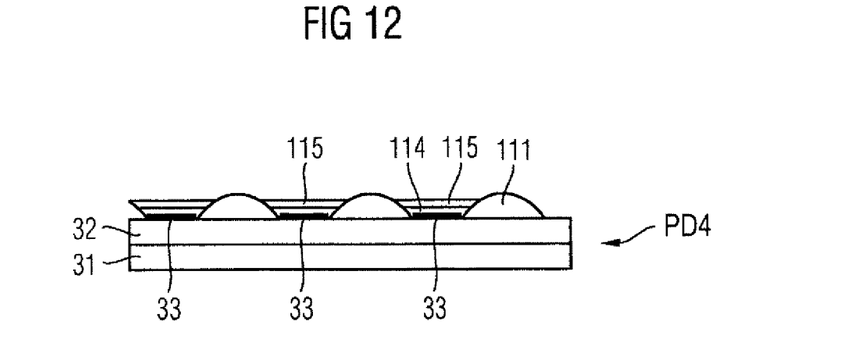
Figure 13:
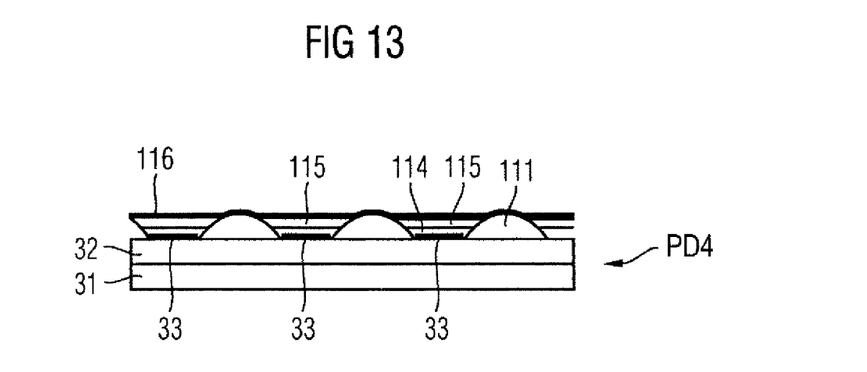

In contrast to the production methods illustrated in FIGS. 3 through 6, in the production method shown in FIGS. 11 through 13 a fluorinated photoresist is initially applied on the structured electrode 33. The fluorinated photoresist has the property that it is poorly wetted by the organic materials for the photoactive layer and the hole transport layer of the photodetector PD4. The fluorinated photoresist is applied at the points that divide the sub-electrodes 33a through 33h of the first electrode 33. A wall structure 111 thereby arises that, in the case of the present exemplary embodiment, has a vertical dimension of approximately 0.5 µm to 5 µm. Furthermore, in the case of the present exemplary embodiment the wall structure 111 has a rounded expansion, whereby the angle α is approximately 3° to 30° between the first electrode 33 and the surface of the wall structure 111. Alternatively, the poor wettability of the photoresist of the wall structure 111 can also be achieved in that the wall structure 111 is initially applied on the electrode 33, wherein the wall structure 111 has an insulating material that does not necessarily have the property of de-crosslinking organic materials. This wall structure is, for example, subsequently provided with a fluorinated plasma; this in turn has a de-crosslinking property.

A hole transport layer 114 made from an organic material is subsequently applied on the structured electrode 33 provided with the wall structure 111, on which hole transport layer 114 is in turn applied a photoactive layer 115 made from an organic semiconductor material (P3HT/PCBM in the exemplary embodiment). This is illustrated in FIG. 12. In the exemplary embodiment, PEDOT:PSS is used as an organic material. The hole transport layer 114 has a vertical dimension of approximately 10 nm to 100 nm and the photoactive layer 115 has a vertical dimension of approximately 100 nm to 1000 nm.

In that the photoresist of the wall structure 111 exerts a de-crosslinking effect on the organic materials of the hole transport layer 114 and of the photoactive layer 115, the hole transport layer 114 and the photoactive layer 115 are sub-divided into active regions associated with sub-electrodes 33a through 33h of the electrode 33.

An unstructured laminar electrode 116 is subsequently vacuum deposited or sputtered onto the photoactive layer 116. In the exemplary embodiment, the laminar electrode 116 replicates the surface structure formed by the photoresist, the hole transport layer 114 and the photoactive layer 115. Via the rounded expansion of the wall structure 111 it is possible to avoid a tearing of the electrode 116, even given a relatively thin hole transport layer 114 and a relatively thin photoactive layer 115. The vapor-deposited or sputtered electrode 116 is shown in FIG. 13.

Figure 14:
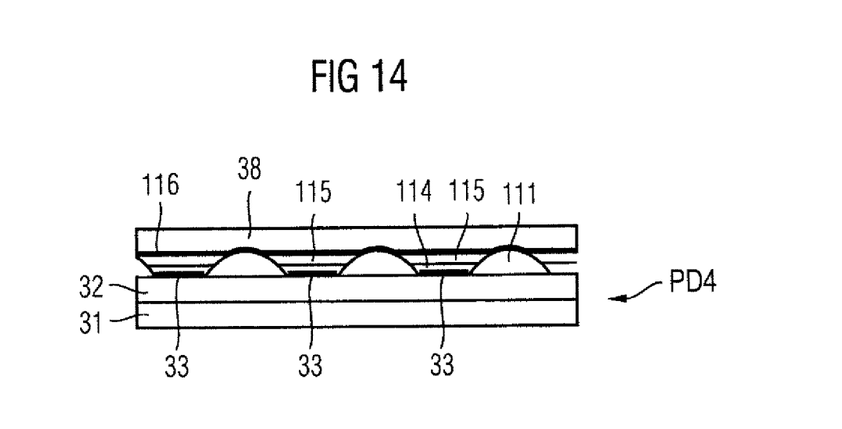

In order to protect the photodetector PD4 from, for example, contamination or damage, in the case of the present exemplary embodiment the electrode 116 is provided with a protective layer 38 made from glass. This is shown in FIG. 14.

Figure 15:
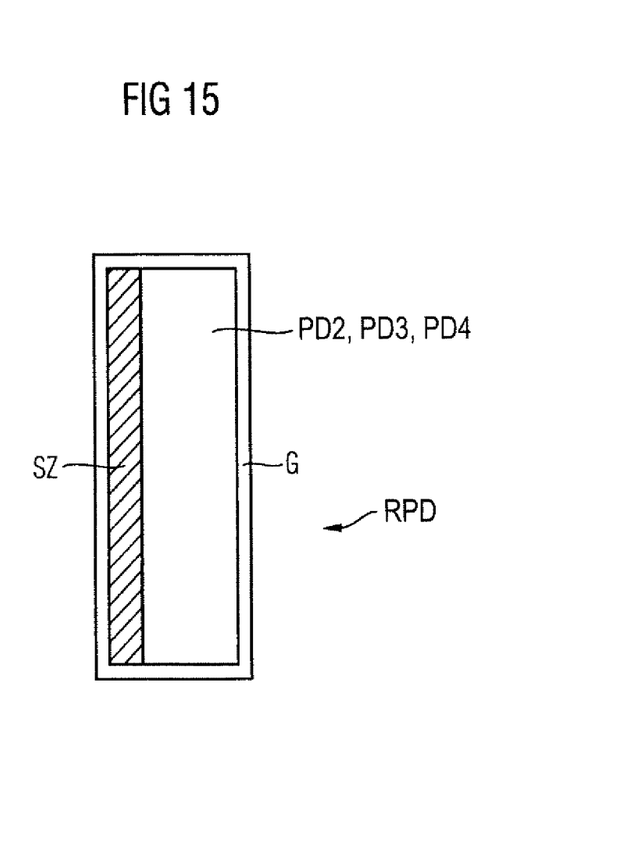
FIG. 15 illustrates an x-ray flat panel detector in accordance with the present invention.

FIG. 15 shows an inventive x-ry flat panel detector RPD. The x-ry flat panel detector RPD essentially includes the photodetector PD2, PD3 or PD4, an x-ray-absorbing layer SZ (that, in the case of the present exemplary embodiment, comprises cesium iodide and is applied on the protective layer 38 of the photodetector PD2, PD3 or, respectively, PD4) and a housing G that surrounds the photodetector PD2, PD3 or, respectively, PD4 with applied x-ray-absorbing layer SZ. The housing G is produced from an optimally x-ray-transparent material (for example aluminum) at least on the side facing towards the x-ray-absorbing layer SZ.

Although modifications and changes may be suggested by those skilled in the art, it is the intention of the inventors to embody within the patent warranted heron all changes and modifications as reasonably and properly come within the scope of their contribution to the art.

The invention claimed is:

1. A photodetector comprising:
    a structured first electrode comprising a plurality of sub-electrodes that are all separated from each other by spaces therebetween;
    a second electrode;
    at least one first organic layer and a second organic layer disposed between said first and second electrodes, one of said first and second organic layers comprising photoactive material that interacts with light to generate electrical charges;
    said at least one first organic layer and said second organic layer each being structured in conformity with said first electrode to subdivide said at least one first organic and said second organic layer into a plurality of active regions stacked directly above and respectively associated with the sub-electrodes of said first electrode, with the plurality of active regions in said at least one first organic layer all being separated from each other by spaces in said at least one first organic layer that are directly above said spaces between said sub-electrodes, and the plurality of active regions in said second organic layer also all being separated from each other by spaces in said second organic layer that are directly above said spaces between said sub-electrodes; and
    additional material that completely fills said spaces between said active regions that separate said active regions from each other and that is in place in said active regions while said photoactive material generates said charges.

2. A laminar organic photodetector as claimed in claim 1 wherein said additional material has an overhanging structure.

3. A laminar organic photodetector as claimed in claim 1 wherein said additional material is a material that repels organic materials of said at least one organic layer and said second organic layer.

4. A laminar organic photodetector as claimed in claim 1 wherein said additional material is a photo resist.

5. A laminar organic photodetector as claimed in claim 1 wherein said at least one first organic layer is a photoactive layer and wherein said second organic layer is a hole transport layer.

6. A laminar organic photodetector as claimed in claim 1 wherein said at least one first organic layer is a hole transport layer and wherein said second organic layer is a photoactive layer.

7. A laminar organic photodetector as claimed in claim 1 comprising a laminar protective layer applied on said second electrode.

8. An x-ray flat panel detector comprising:
an x-ray absorbing layer;
a laminar organic photodetector on which said x-ray absorbing layer is applied, said laminar organic photodetector comprising a structured first electrode comprising a plurality of sub-electrodes that are all separated from each other by spaces therebetween, a second electrode, at least one first organic layer and a second organic layer disposed between said first and second electrodes, one of said first and second organic layers comprising photoactive material that interacts with light to generate electrical charges, and each of said at least one first organic layer and said second organic layer being structured in conformity with said first electrode to subdivide said at least one first organic and said second organic layer into a plurality of active regions stacked directly above and respectively associated with the sub-electrodes of said first electrode, with the plurality of active regions in said at least one first organic layer all being separated from each other by spaces in said at least one first organic layer that are directly above said spaces between said sub-electrodes, and the plurality of active regions in said second organic layer also all being separated from each other by spaces in said second organic layer that are directly above said spaces between said sub-electrodes; and
additional material that fills said spaces between said active regions that separate said active regions from each other and that is in place in said active regions while said photoactive material generates said charges.

9. A method for producing a laminar organic photodetector comprising a first electrode comprising a plurality of sub-electrodes that are all separated from each other by spaces therebetween, a second electrode, at least one first organic layer and a second organic layer disposed between said first and second electrodes, one of said first and second organic layers comprising photoactive material that interacts with light to generate electrical charges, said method comprising the steps of:
applying an intermediate material on said structured first electrode, said intermediate material having a wall structure extending vertically from said structured first electrode and conforming to the structure of said at least one organic layer and said second organic layer;
laminarly applying said at least one first organic layer on said first electrode with said wall structure in place on said structured first electrode;
laminarly applying said second organic layer on said at least one first organic layer with said wall structure in place on said structured first electrode;
laminarly applying said second electrode on said second organic layer with said wall structure in place on said structured first electrode;
with said wall structure, structuring said at least one first organic layer, said second organic and said second electrode in conformity with said structured first electrode by sub-dividing each of said at least one first organic layer, said second organic layer and said second electrode into a plurality of active regions stacked directly above and respectively associated with the sub-electrodes of said first electrode, with the plurality of active regions in said at least one first organic layer all being separated from each other by spaces in said at least one first organic layer that are directly above said spaces between said sub-electrodes of said first electrode, and the plurality of active regions in said second organic layer also being separated from each other by spaces in said second organic layer that are directly above said spaces between said sub-electrodes of said first electrode, and said second electrode comprising a plurality of sub-electrodes that are all separated from each other by spaces in said second electrode that are directly above said spaces between said sub-electrodes of said first electrode; and
filling, with additional material, said spaces between said active regions that separates said active regions from each other and that is in place in said active regions while said photoactive material generates said charges.

10. A method as claimed in claim 9 comprising employing a photoresist as said intermediate layer.

11. A method as claimed in claim 9 comprising forming said wall structure as an overhanging structure.

12. A method as claimed in claim 9 comprising employing a material as said intermediate material that repels organic materials in said at least one first organic layer and said second organic layer.

13. A method as claimed in claim 9 comprising employing a photoactive layer as said first organic layer and employing a hole transport layer as said second organic layer.

14. A method as claimed in claim 9 comprising employing a hole transport layer as said first organic layer and employing a photoactive layer as said second organic layer.

15. A method for producing a laminar organic photodetector comprising a first electrode comprising a plurality of sub-electrodes that are all separated from each other by spaces therebetween, a second electrode, at least one first organic layer and a second organic layer disposed between said first and second electrodes, one of said first and second organic layers comprising photoactive material that interacts with light to generate electrical charges, said method comprising the steps of:
applying an intermediate material on said structured first electrode, said intermediate material having a wall structure extending vertically from said structured first electrode and conforming to the structure of said at least one organic layer and said second organic layer;
laminarly applying said at least one first organic layer on said first electrode with said wall structure in place on said structured first electrode;
laminarly applying said second organic layer on said at least one first organic layer with said wall structure in place on said structured first electrode;
laminarly applying said second electrode on said second organic layer with said wall structure in place on said structured first electrode;
with said wall structure, structuring said at least one first organic layer, said second organic and said second electrode in conformity with said structured first electrode by sub-dividing each of said at least one first organic layer, said second organic layer and said second electrode into a plurality of active regions stacked directly above and respectively associated with the sub-electrodes of said first electrode, with the plurality of active regions in said at least one first organic layer all being separated from each other by spaces in said at least one first organic layer that are directly above said spaces between said sub-electrodes of said first electrode, and the plurality of active regions in said second organic layer also being separated from each other by spaces in said second organic layer that are directly above said spaces between said sub-electrodes of said first electrode, and said second electrode comprising a plurality of sub-electrodes that are all separated from each other by spaces in said second electrode that are in alignment with said spaces between said sub-electrodes of said first electrode;

applying an x-ray absorbing layer on said laminar organic photodetector; and filling, with additional material, said spaces between said active regions that separates said active regions from each other and that is in place in said active regions while said photoactive material generates said charges.

* * * * *